United States Patent
Kemmochi et al.

(10) Patent No.: US 7,427,327 B2
(45) Date of Patent: Sep. 23, 2008

(54) SILICA GLASS CRUCIBLE WITH BARIUM-DOPED INNER WALL

(75) Inventors: Katsuhiko Kemmochi, Camas, WA (US); Yasuo Ohama, Fukui (JP)

(73) Assignee: Heraeus Shin-Etsu America, Inc., Camas, WA (US)

( * ) Notice: Subject to any disclaimer, the term of this patent is extended or adjusted under 35 U.S.C. 154(b) by 0 days.

(21) Appl. No.: 11/536,517

(22) Filed: Sep. 28, 2006

(65) Prior Publication Data

US 2007/0051297 A1    Mar. 8, 2007

Related U.S. Application Data

(63) Continuation-in-part of application No. 11/223,158, filed on Sep. 8, 2005.

(51) Int. Cl.
*C30C 35/00* (2006.01)

(52) U.S. Cl. .................... 117/200; 65/33.1; 65/DIG. 8; 117/217

(58) Field of Classification Search .................. 65/33.1, 65/47, 59.21, DIG. 8; 117/13, 200, 217
See application file for complete search history.

(56) References Cited

U.S. PATENT DOCUMENTS

| | | | |
|---|---|---|---|
| 4,416,680 A | 11/1983 | Bruning et al. |
| 4,632,686 A | 12/1986 | Brown et al. |
| 4,637,571 A | 1/1987 | Holder et al. |
| 4,935,046 A | 6/1990 | Uchikawa et al. |
| 4,956,208 A | 9/1990 | Uchikawa et al. |
| 5,885,071 A | 3/1999 | Watanabe et al. |
| 5,976,247 A | 11/1999 | Hansen et al. |
| 5,980,629 A | 11/1999 | Hansen et al. |
| 5,989,021 A | 11/1999 | Sato et al. |
| 6,136,092 A | 10/2000 | Sato et al. |
| 6,319,313 B1 | 11/2001 | Phillips et al. |
| 6,350,312 B1 | 2/2002 | Phillips et al. |
| 6,461,427 B2 | 10/2002 | Phillips et al. |
| 6,510,707 B2 | 1/2003 | Kemmochi et al. |
| 6,641,663 B2 | 11/2003 | Kemmochi et al. |
| 6,797,061 B2 | 9/2004 | Sato et al. |
| 2001/0032580 A1 | 10/2001 | Phillips et al. |

FOREIGN PATENT DOCUMENTS

| | | |
|---|---|---|
| EP | 0911429 | 4/1999 |
| JP | 1126238 | 5/1989 |
| JP | 6219768 | 8/1994 |
| JP | H8-2932 | 1/1996 |

(Continued)

*Primary Examiner*—Felisa Hiteshew
(74) *Attorney, Agent, or Firm*—Marger Johnson & McCollom, PC (57) ABSTRACT

A silica glass crucible includes a thin barium-doped inner layer, a stable, bubble-free intermediate layer, and a stable opaque outer layer. The fusion process of the present invention controls the dynamic gas balance at the fusion front where formed grain is melted to dense fused silica. The crucible demonstrates reduced bubble growth during a Czochralski process. As a result of the thin barium-doped layer and the reduced bubble growth, the inner surface of the crucible is uniformly minimally textured during a CZ process. The present crucible is especially suited for intense CZ processes for manufacturing silicon ingots used for solar cells or with silicon that is heavily doped with antimony, boron, or arsenic.

15 Claims, 4 Drawing Sheets

FOREIGN PATENT DOCUMENTS

| | | |
|---|---|---|
| JP | 8040737 | 2/1996 |
| JP | 09-255476 | 9/1997 |
| JP | 10025184 | 1/1998 |
| JP | 2000-247778 | 9/2000 |
| WO | 00/55394 | 9/2000 |
| WO | 00/55395 | 9/2000 |
| WO | 02/40732 | 5/2002 |

SILICA GLASS CRUCIBLE WITH BARIUM-DOPED INNER WALL

This application is a continuation-in-part of U.S. application Ser. No. 11/223,158, filed on Sep. 8, 2005, for a Silica Glass Crucible with Bubble-Free and Reduced Bubble Growth Wall, which is hereby incorporated herein by reference for all purposes.

BACKGROUND OF THE INVENTION

1. Field of the Invention

The present invention relates to the field of silica crucibles and more particularly to a silica crucible having a multi-layer wall with a barium-doped inner layer.

2. Background of the Invention

The Czochralski (CZ) process is well-known in the art for production of ingots of single crystalline silicon, from which silicon wafers are made for use in the semiconductor industry.

In a CZ process, metallic silicon is charged in a silica glass crucible housed within a susceptor. The charge is then heated by a heater surrounding the susceptor to melt the charged silicon. A single silicon crystal is pulled from the silicon melt at or near the melting temperature of silicon.

Some CZ processes, e.g., those that are heavily doped and those used to make ingots for solar cells, have very high temperatures or very high reactivity between the melt and the crucible. When pulling an ingot from which solar cell wafers are cut very high efficiency is required. This requires intense heat for fast melting at the initial stages as well as a prolonged run. These types of CZ processes emphasize the need to improve the useful life of the crucible.

At operating temperatures, the inner surface of a silica crucible frequently reacts with the silicon melt. In many cases, the inner surface of the crucible undergoes a change in morphology. The inner surface of a crucible is seen to roughen during prolonged operation in a CZ run.

This roughening can cause a loss of crystal structure of the pulled ingot. Inner surface roughening renders the crucible unfit for use in silicon ingot manufacture. When a major portion of the inner surface of the crucible is covered by a rough surface, crystalline structure is disrupted at the crystal-melt interface. Such a roughened crucible is unsuitable for ingot manufacture and silicon crystal pulling using a roughened crucible must be ceased to avoid manufacture of sub-standard ingots.

Additionally, the inner surface of a silica glass crucible can partially dissolve into the silicon melt during the CZ process. Silicon and oxygen, the main components of a silica crucible, are not deleterious to the silicon melt. However, impurities in the inner layer of the crucible can be transferred to the silicon melt during this process. The quality of the pulled single crystal may be ruined, depending on the extent of contamination and the nature of the contaminant.

One such effort to control inner surface morphology is a crucible with barium-containing chemicals coated onto the inner surface, which promotes devitrification on the inner surface of the crucible. This is the phase transformation from amorphous silica to crystalline silica. Devitrification prevents particulate generation at the silica-melt interface. The devitrified layer, created during a CZ run, comprises a crystallized silica layer and is reported to dissolve uniformly and maintain a smooth crucible inner surface.

If the crystalline layer so formed is too thick, the volume change caused by the phase transformation results in cracking of this layer. This permits melt penetration between the crystallized and amorphous layers, which can ultimately result in the cracked layer pealing off.

In addition, bubble expansion in the undoped crucible wall beneath the doped layer releases gas that may result in pitting of the doped layer on its inner surface, even when the inner surface is not subject to cracking as a result of expansion during devitrification.

DETAILED DESCRIPTION OF THE PREFERRED EMBODIMENTS

One aspect of the present invention provides a silica glass crucible comprising an innermost barium-doped layer to promote devitrification and an intermediate layer that is thick enough for prolonged operation and is free of bubbles and bubble growth. The crucible further comprises a stable outer layer that shows little swelling during multiple ingot pulls.

The intermediate layer is bubble-free ("BF") and exhibits no-bubble-growth ("NBG") and is 2 mm or more thick. The barium-doped inner layer is less than about 0.4 mm thick, but is preferably less than about 0.2 mm thick. Stability of the outer layer is determined using a vacuum bake test ("VBT"), in which wall thickness change, which corresponds to apparent density, is measured after baking the crucible at approximately 1650 degrees C. for approximately three hours at a pressure of approximately 0.1 Pa. More specifically, an observed thickness increase of the present crucible after the VBT is less than 1%, and the apparent density after the VBT is more than 2.05 g/cm$^3$.

A silica glass crucible according to this aspect of the invention is made by introducing bulk silica grain, comprising essentially quartz grain, into a rotating crucible mold. This forms a bulky wall. The formed grain is then heated to fuse a crucible while a pump communicating with the mold draws air through the formed grain, gas released from the calcined grain, and gas released from grain as it fuses. The total gas is dynamically balanced with the conductance of a flow passageway connecting the inner mold surface with the pump and the evacuation power of the pump. This dynamic balance is controlled to keep a balance of mass at the gaseous phase at the fusion front in the formed grain less than a threshold value that is required to make a BF or NBG silica glass layer.

After the innermost surface of the formed grain fuses, barium-doped grain is introduced and melted as it travels toward the fused innermost surface thus creating a barium-doped layer that is fused to the innermost surface of the formed grain.

The apparatus to make the crucible has a flow passageway connecting the inner mold surface with the pump, in which flow resistance is low enough, and a pumping power is high enough to achieve the required dynamic balance. The flow passageway can include structures such as, e.g., piping, valves, gauges, and the gas-permeable mold itself. The flow resistance of the gas-permeable mold can be controlled using channels in the graphite mold and a porous material facing, such as graphite, on the inside of the mold.

The heat to fuse the formed grain must be intense enough to cook the fused silica so that gas is not released during the CZ process. Such gas release causes formation of bubbles and bubble growth in the crucible wall. This gas release results in swelling of the crucible wall, which in turn causes perturbations of the melt level.

In more detail, one aspect of the present invention provides a silica glass crucible suitable for use in a CZ process. The crucible has a bubble-free intermediate layer that is 2 mm or more in thickness, an opaque outer layer, and a barium-doped inner layer that ranges up to about 0.4 mm in thickness. The wall thickness change after a VBT, which is an accelerated simulation of a CZ process, is equal to or less than 3%, preferably less than 1%. In other words, the apparent density of the crucible wall after the VBT is equal to or greater than 2.05 g/cm³. This small thickness change is a result of combination of minimal bubble growth in the opaque layer and minimal bubble evolution and growth in the inner layer.

After the VBT, the inner bubble-free layer contains less than 1% bubbles by volume in cross-sectional area and the individual bubbles will not grow more than 0.3 mm in diameter. Bubble content is measured as a ratio of the sum of bubble image area divided by total area in a cross section picture of transmission optical microscope. The bubble size is also measured using a transmission optical microscope.

The wall thickness change of the entire wall is measured with a micrometer. The opaque layer is preferably 50% to 70% of the wall and 25% at minimum to satisfy good heat diffusing characteristics. The apparent density of the opaque layer after a VBT is preferably greater than 2.05 g/cm³.

Figure 1:
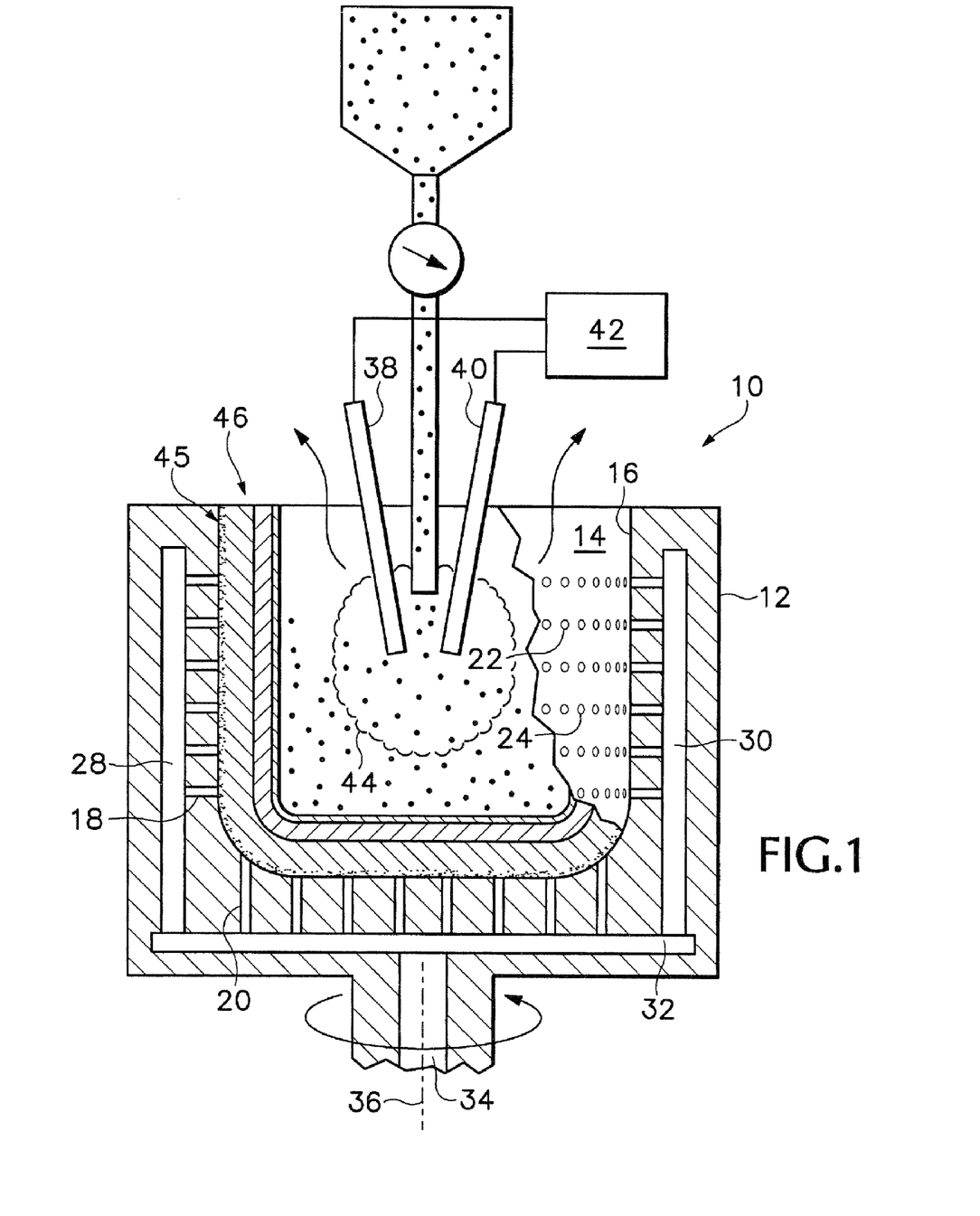
FIG. 1 is a cross-sectional, somewhat schematic, side view of a mold having a crucible formed therein.
Figure 1A:
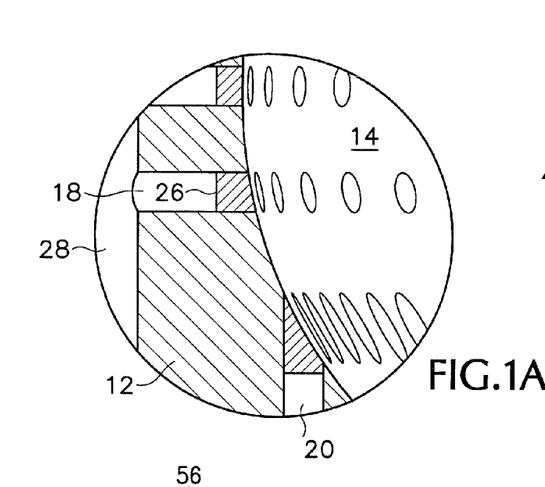
FIG. 1A is an enlarged cross-sectional side view of an air channel of the crucible mold of FIG. 1.

Turning attention now to FIGS. 1 and 1A, indicated generally at 10 is a system for fusing a silica crucible in accordance with the present invention. The system includes a mold 12 having an inner mold surface 14. Mold surface 14 includes a substantially cylindrical vertical wall 16. In the mold of FIG. 1, wall 16 defines a cylindrical cavity having a diameter of about 18 inches, but the invention may be equally well practiced with molds having both smaller and larger diameters.

A plurality of air channels, like air channels 18, 20 (viewable in both FIGS. 1 and 1A) communicate with inner mold surface 14. Each air channel comprises a cylindrical bore that creates a circular opening, like openings 22, 24, on mold surface 14. Each air channel, like channel 20 in FIG. 1A, includes a porous graphite plug, like plug 26, which prevents silica from being drawn from the mold cavity into the air channels. The air channels communicate with manifolds, like manifolds 28, 30, 32, which in turn communicate with a bore 34. A pump (not visible in the drawings) is connected to bore 34. The pump is configured to draw air from the mold cavity via the air channels and ultimately through bore 34 and out of system 10. The pump typically has a capacity of between about 80 and 350 cubic meters per hour, although as will be seen, the invention may be practiced with pumps outside this range depending on the conductivity of the channels, bores, manifolds, valves, and other structure disposed between mold surface 14 and the pump. All of the structure disposed between mold surface 14 and the pump is referred to herein as a flow passageway.

Mold 12 can be rotated by a motor (not shown) about a vertical axis 36. A set of conventional electrodes 38, 40 is vertically movable into and out of the mold interior. The electrodes are connected to a conventional DC power supply 42 that can apply power to the electrodes in a selectable range between about 300 KVA and 1200 KVA. When sufficient power is applied to electrodes 12, 14, an extremely hot plasma gas ball 38 forms around the electrodes.

Figure 2:
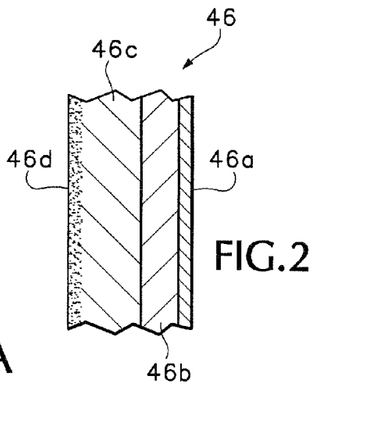
FIG. 2 is an enlarged view of the wall of the crucible of FIG. 1.

Mold 12 contains a substantially formed crucible 45 that is made up of a layer 46 (shown enlarged in FIG. 2) of substantially fused silica, which is shown partially broken away to expose mold surface 14. Layer 46 includes an inner layer 46a, which is a barium-doped fused silica layer that can range in average thickness up to about 0.4 mm; an intermediate layer 46b of clear glass that is typically greater than about 2.0 mm thick; and an outer bulk layer 46c, which comprises opaque glass. Together layers 46a, 46b, 46c comprise the wall of crucible 45, which was just formed in the mold. A thin layer of unfused grain 46d is left because temperature at the inner mold surface cannot reach the melting point of the formed grain.

Generally describing the operation of system 10, natural quartz grain is placed in mold 12 as it rotates about axis 36. The outer layer of the crucible, i.e., the first grain received in the mold may be doped with aluminum in the manner described in U.S. patent application Ser. No. 09/906,879, filed Jul. 16, 2001, which is assigned to the assignee of the present application and is hereby incorporated by reference for all purposes. Once all the grain is received in the mold, power is applied to electrodes 38, 40 and the pump (not visible) is turned on. Once the electrodes heat the grain to the point were the grains on the innermost surface begin to fuse, a fusion front forms and proceeds over time from the innermost surface of the crucible to near mold surface 14, where the fusion front saturates. As will be explained, when the gas evolved from the heated and fusing grain plus the gas drawn through the unfused grain—via both the inner and upper surfaces of the formed grain—bears a predetermined relationship with the pump power and the conductivity of the flow passageway, the qualities of the formed crucible may be precisely controlled. After the grains on the innermost surface fuse, barium-doped grain is added through the plasma to create an innermost crucible layer comprising a thin barium-doped fused-silica glaze.

There are several requirements of balance for the key parameters. First, assume the amount of fused silica as a function of time t is G(t).

Initially, the rate of fused silica increases slowly due to time spent preheating the silica to the required melting temperature. A fused silica-grain interface then proceeds promptly until it approaches the mold inner surface. At a certain point, the fusion front saturates, leaving unfused grain between the mold and the fused crucible. It has been found that G(t) can be approximately expressed by an error function.

When fusion proceeds, a significant amount of gas is evolved proportional to the fusion rate. The rate of gas evolution, V1, is defined as gas volume released by fusion per weight of fused grain per unit time:

$$V1 = A \cdot \partial G(t)/\partial t \qquad (1)$$

Here A is a proportional constant.

The formed grain is not dense enough to keep the fusion front isolated from the environment. Even if the inner surface of the crucible is covered by a dense glassy phase, air can pass through the unfused grain between the fused wall and the mold at the top of the crucible. The evacuation system therefore should handle this leaking gas in addition to the evolved gas. Leaking gas is found to be proportional to the amount of unfused grain. More exactly, it is found to be proportional to the third power of $(1-\mathrm{erf}(t))$, where $\mathrm{erf}(t)$ is the error function and B is a proportional constant.

$$V2 = B \cdot (1-\mathrm{erf}(t))^3 \quad (2)$$

These two parameters, V1 and V2, are the main sources of gas to be removed by the evacuation means. The amount of evacuated gas is expressed in equation (3), where P is pumping power and C is normalized conductance of the flow passageway, i.e., $0 \leq C \leq 1$.

$$V3 = P \cdot C \quad (3)$$

At the fusion front of the grain-fused silica interface, gas flow is balanced between V3 and (V1+V2). If the total balance, V1+V2−V3, becomes positive, fused glass will contain more dissolved gas; if it exceeds a certain threshold, Q1, bubbles are introduced in the fused silica. If the balance is negative, fused silica contains less dissolved gas. A second threshold, Q2, can be used to make bubble-free glass, and another threshold, Q3, for no-bubble-growth characteristics. Here Q1 is not necessarily equal to Q2.

Q3 and Q2 are negative as expected. It has been determined that Q3 is more negative than Q2; i.e., Q3<Q2. After the VBT, which is an accelerated simulation of a CZ process, evolution or growth of bubbles is observed in traditional crucibles-even if the crucible is bubble-free as made. Evolution and growth of these bubbles results from the release of dissolved gas in the inner layer. The dissolved gas is related to the level of negativity of the balance (V1+V2−V3).

It is also found that bubble growth characteristics are strongly affected by the fusion temperature. Because the fusion rate increases with fusion temperature, high fusion rate results in the increase of released gas. It is critical to increase fusion temperature to meet NBG requirements. But if substantially all of the increased gas is not evacuated as it forms, bubbles will form, which is disadvantageous in the inner layer.

The goal in crucible manufacture is to design the apparatus to keep (V1+V2−V3) properly negative to satisfy BF+NBG requirement for the inner layer and NBG requirement for outer layer, while simultaneously meeting the layer thickness requirements. More specifically, (V1+V2−V3) can be controlled to create a BF+NBG inner layer and a NBG outer layer while making large crucibles (i.e., nominal sizes larger than 24-inch) using greater than 300 KVA DC arc supply (and preferably more than 950 KVA), and using an evacuation pump having a capacity of greater than 200 cubic meter per hour (free air displacement) and preferably greater than 350 cubic meter/hour.

The most prominent constraint point to creating such crucibles is the flow passageway, such as piping, joints and valves. It must have a greater than 10 $cm^2$ minimum cross-sectional area and preferably equal to or greater than about 50 mm circular diameter (that is, an area of about 19.6 $cm^2$). This dimension is in sharp contrast to structures of the prior art, wherein such piping typically has a diameter of about 12 mm (i.e, an area of about 1.13 $cm^2$).

The narrowest cross section is located at the interface with the formed grain; it is imperative that these channels be kept small enough to prevent grain from being drawn by reduced pressure into the evacuation system.

The individual openings of the flow passageway at the grain interface are each preferably at least 0.2 square centimeters ($cm^2$), and more preferably at least 0.6 $cm^2$. The interface is equipped with a porous material, such as a porous graphite plug 26, with a cross-sectional area as abovementioned, and a maximum length of about 25 mm. For mechanical reasons, 12 mm has been found to be optimal.

A method for making the present crucible using the above-mentioned apparatus follows. It has been found that BF and NBG characteristics are primarily determined during transformation from silica grain to fused silica. Neither a pre-heat-treatment (such as calcination of grain) nor a post-heat-treatment (e.g., intense cooking after crucible fusion) is found to significantly alter the BF or NBG characteristics.

Another aspect of the invention is that vacuum level alone does not fully yield BF or NBG control; it is a dynamic balance of introduced and removed gas that has proved is essential. For NBG characteristics, released gas during crucible use in a CZ process is also essential. It has been determined that released gas is closely related to the fusion temperature. In other words, intense cooking is the key for NBG.

Providing a thin innermost crucible layer of barium-doped fused silica grain provides advantages associated with barium doping while doing so in a layer that is thin enough to prevent cracking as its volume expands during devitrification. Such a crucible is especially useful for silicon melts that are heavily doped with antimony, arsenic, or boron.

Figure 3:
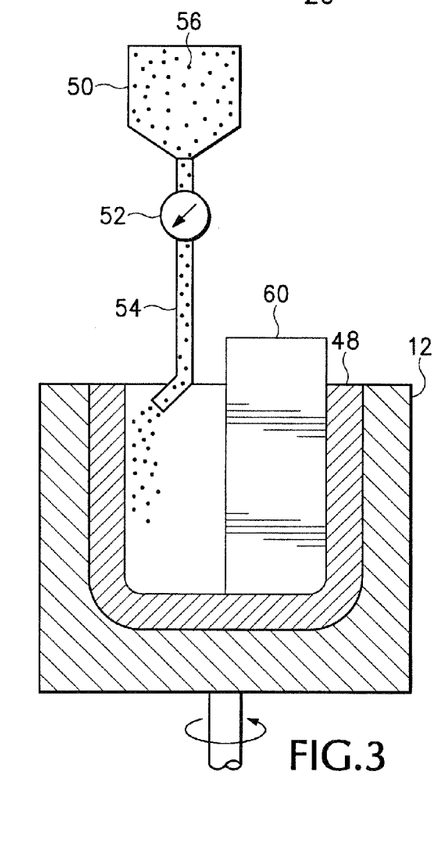
FIGS. 3 and 4 are schematic depictions of a method for using the mold of FIG. 1 to make the silica glass crucible that is also shown in FIG. 1.
Figure 4:
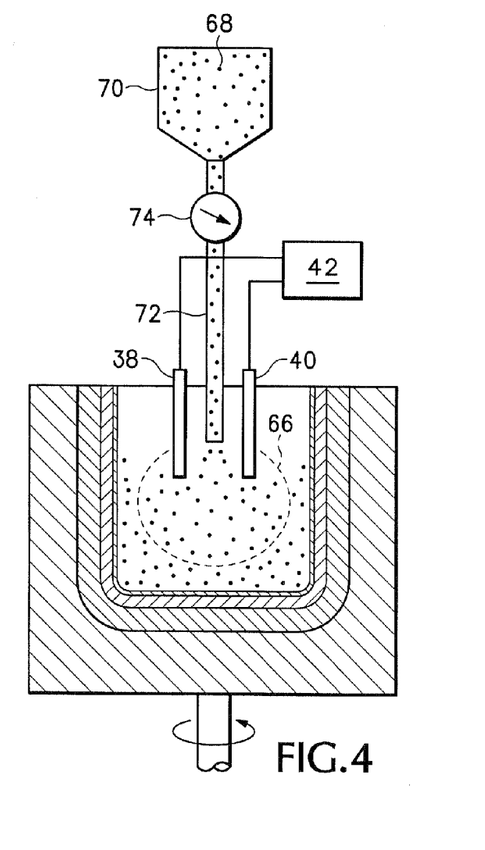

The method illustrated in FIGS. 3 and 4 depicts how system 10 in FIG. 1 is used to make crucible 45, also shown in FIG. 1. To form a bulk grain layer 48, the bulk grain hopper 50, flow regulating valve 52, and feed tube 54 are used. In FIG. 3, bulk silica grain 56 is introduced into mold 12 to form the bulk grain layer 48. The bulk silica grain 56 is preferably pure quartz grain. A scraper 60 shaped to conform to the inner surface of the mold, is generally used to shape the introduced bulk silica grain. In this manner, the bulk grain layer 48 can be formed to a selected thickness.

Fusion of formed silica grain is shown in FIG. 4. Electrodes 38, 40 are positioned partially within the interior cavity of the rotating mold 12. An electric arc is produced between electrodes 38, 40 as described above. A region of heat 66 is thereby generated within the mold interior. This heat 66 serves to fuse formed bulk grain layer 48 in the mold.

Fusion proceeds through the formed grain from proximal to distal, relative to electrodes 38, 40. The mechanism of progressive fusion through the silica grain layer according to this technique is known to those skilled in the art, for example, as disclosed in U.S. Pat. Nos. 4,935,046 and 4,956,208 both to Uchikawa et al.

After fusion of the surface of the formed bulk grain layer 48, inner silica grain 68 is poured from the inner silica grain hopper 70 through feed tube 72. Inner grain flow regulating valve 74 can be utilized to control the rate at which inner layer grain 68 is introduced into the region of heat 66. The arc produced between the electrodes creates a very strong plasma field, propelling the partially melted inner silica grain 68 outward, enabling it to be deposited on the sides and bottom of the crucible inner surface. The inner grain 68 passes through the heated region 66, is at least partially melted by the arc flame therein, and is deposited on the surface of the fused bulk grain layer 48.

This inner grain 68 fuses to the bulk layer to form inner layer 46a. Molten inner grain thereby is continuously deposited and fused over a period of time to form inner layer 46a. The thickness of fused inner layer 46a is controlled by the introduction rate of inner silica grain and by the period of inner grain supply during fusion.

Inner silica grain 68 consists essentially of pure silica grain, such as natural silica grain washed to remove contaminants, doped with barium. Alternatively, synthetic silica grain doped with barium can be used.

In a first example, an 18-inch diameter mold is used to form a crucible having an 18-inch outside diameter, like crucible 45 in FIG. 1. After placing substrate grain 58 into mold 12 and shaping to form bulk grain layer 48, as shown in FIG. 3, an evacuation rate having a free air displacement of about 300 m$^3$/hr. is applied for 90 seconds via bore 34 while electrodes 38, 40 generate heat region 66, in FIG. 4. This establishes a fusion front that proceeds from the inner surface of the bulk grain in the mold toward the mold wall. At around 90 seconds, the fusion front reaches the outermost wall of layer 46b. This establishes clear-glass layer 46b.

Thereafter, vacuum is reduced to around 700 torr and the fusion front proceeds close to the mold wall. Layer 46d represents a narrower lawyer of unfused silica that does not become hot enough to fuse because of the close proximity of the mold wall.

Sometime after the innermost layer of layer 46b is established, i.e., the fusion front begins its movement toward the mold wall, barium-doped grain is dispensed from hopper 70 into the heat region 66. This grain is at least partially melted in the heated region and propelled by the plasma toward the fused bulk wall thus forming barium-doped layer 46a. In this example grain 68 comprises grain doped with 100 wt ppm barium. This grain ranges in size from 100 to 300 micrometers. Because the grain may only be partially melted by the heated region, it is not necessarily uniformly distributed, and the inner layer may vary in doping levels and depth, which could be as shallow as less than 0.1 mm in some areas but averaging around 0.2 mm. In this example, a total of 90 grams of 100 wt ppm barium-doped grain is supplied from hopper 70 for a single 18-inch crucible.

In this example 90 grams of the doped grain is supplied from between about 6 minutes until about 7 minutes and 10 seconds after start of heating. As a result, intermediate layer 46b and a substantial portion of bulk layer 46c is formed before starting formation of layer 46a. The full evacuation flow rate of about 300 m$^3$/hr starts at the beginning of heating and switches to 700 torr vacuum about 90 seconds after heating begins. The 700 torr vacuum is held for about another 8 minutes, when fusion is substantially complete.

In another example, all parameters remain the same except that 160 grams of the doped grain is supplied. Greater than about 400 grams produces a thick layer 46a that expands enough in use as silicon is heated in the crucible to crack and permit the melt to penetrate to layer 46b. This adversely affects the CZ process.

It should be noted that the advantages of a thinly doped barium layer may be obtained without using a high vacuum to create layer 46b. In other words, the thin barium inner layer (less than about 0.2 mm average thickness) may be applied as described above to promote devitrification while remaining thin enough to avoid cracking as the layer expands during the CZ process.

Figure 5:
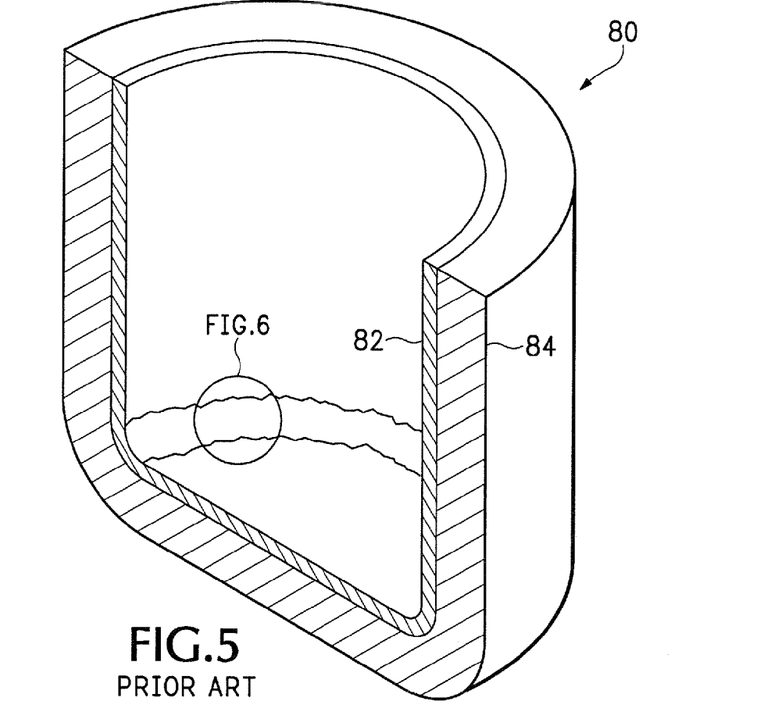
FIG. 5 is a sectional perspective view of a first prior art crucible after use in a CZ process.
Figure 6:
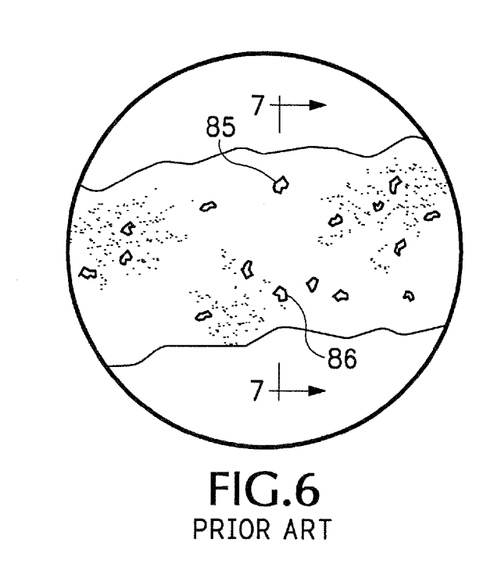
FIG. 6 is an enlarged partial view of a portion of the FIG. 5 crucible.

Turning to FIG. 5, a first prior art crucible 80 includes a fused silica outer wall 82, which does not exhibit the bubble-free and no-bubble-growth qualities described above, and a barium-doped inner layer 84, which, in the prior art, is greater than 0.2 mm. As can be seen in the enlarged view in FIG. 6, during a CZ melt, crucible 80 developed pits, like pit 85, 86 (also viewable in FIG. 7), and cracks in the junction between the bottom and the wall, which is the hottest area during the CZ process. These pits and cracks result from bubbles trapped in layer 82 during manufacture of the crucible. During the CZ process, these bubbles grow and release gas thus creating the cracked and pitted surface shown in FIG. 6. This can release particles into the melt during the CZ process. When severe enough, the melt in the CZ process can penetrate into layer 82, which is not desirable.

Figure 7:
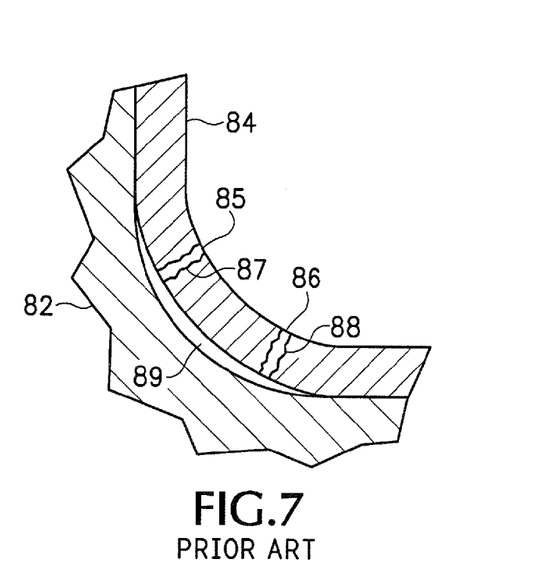
FIG. 7 is a cross-sectional view taken along line 7-7 in FIG. 6

As can be seen in FIG. 7, the bubbles that form pits 85, 86, also form passageways 87, 88, which communicate with the interlace 89 between doped layer 84 and layer 82. As a result, the silicon melt within crucible 80 penetrates into interface 89.

Figure 8:
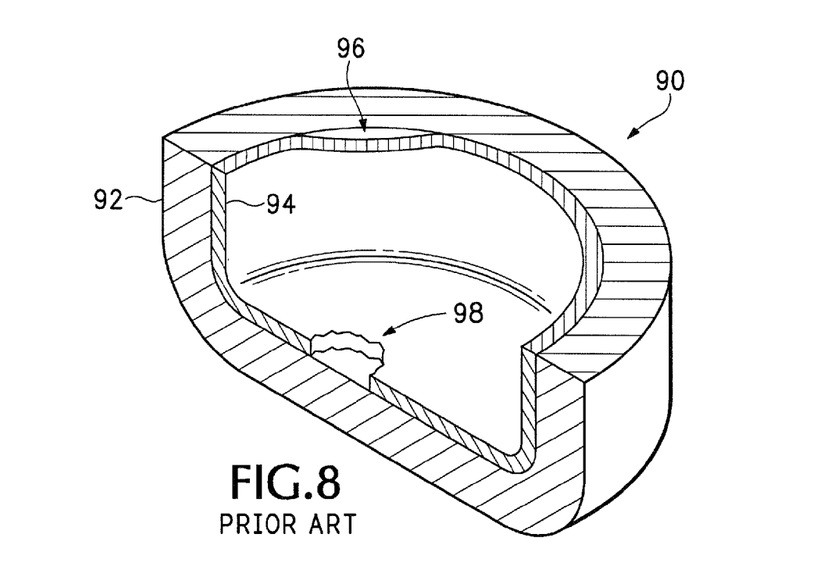
FIG. 8 is a sectional perspective view of a second prior art crucible after use in a CZ process.

Another crucible 90, in FIG. 8, is made like crucible 80 in FIG. 5. It also includes an outer fused wall 92 and an inner barium-doped layer 94. During a CZ melt, layer 94 delaminated, indicated generally at 96, thus leaving a gap between layers 92, 94. Another portion of layer 94, indicated generally at 98, delaminated and peeled off thus exposing the surface of layer 92 to the melt during the CZ process. These conditions result from the expansion of the volume of layer 94 as it devitrifies during the CZ melt. Both conditions adversely affect the CZ process.

Figure 9:
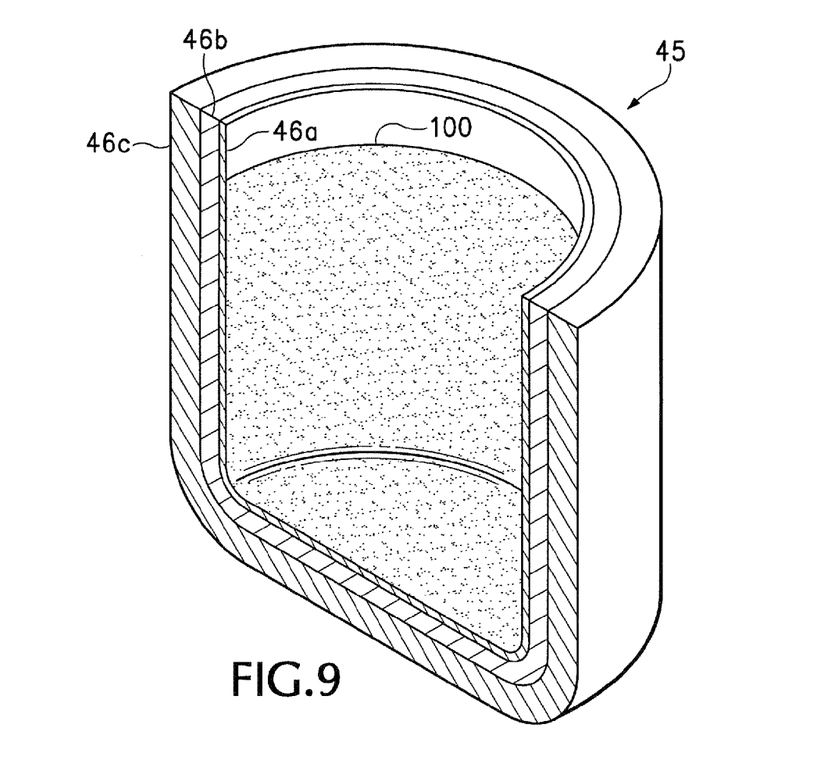
FIG. 9 is a sectional perspective view of a crucible implemented according to the present invention after use in a CZ process.

Finally, FIG. 9 shows crucible 45 (in FIG. 1) after it has been used in a CZ process. A melt line 100 is visible on the crucible. This melt line is a shallow groove formed at the junction of the crucible, the melt, and the atmosphere around the crucible during the CZ process. As can be seen, below the melt line the surface is uniformly minimally textured as a result of being exposed to the silicon melt. But there is no cracking, pitting, delaminating, or peeling off of the barium-doped layer as in the prior art. Both examples mentioned above were generally in the condition just described and seen in FIG. 9.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

While the invention has been disclosed in its preferred form, the specific embodiments thereof as disclosed and illustrated herein are not to be considered in a limiting sense. Indeed, it should be readily apparent to those skilled in the art in view of the present description that the invention can be modified in numerous ways. The inventor regards the subject matter of the invention to include all combinations and subcombinations of the various elements, features, functions and/or properties disclosed herein.

The invention claimed is:

1. A method for making a fused silica crucible comprising:
feeding bulk silica grain along an inner surface of a rotating mold to arrange the bulk silica grain in a crucible shape having a radially inner surface open to an interior space of the mold and a radially outer surface adjacent an inner wall of the mold;
heating the bulk silica grain from the interior space of the mold;
drawing air through the bulk silica grain and into ports distributed in the inner wall of the mold;
evolving gas from the heated grain;
establishing a fusion front that begins at the radially inner surface and proceeds toward the radially outer surface;
maintaining a pressure differential between the fusion front and the inner wall of the mold that draws gas away from the fusion front at a rate faster than it is introduced until the silica grain forms an intermediate glass layer greater than approximately 2 millimeters and having less than about 1% bubbles by volume in cross-sectional area after a vacuum bake test in which the fused silica crucible is heated at approximately 1650 degrees C. for approximately three hours at a pressure of approximately 0.1 Pa;

thereafter reducing the pressure differential between the fusion front and the inner wall of the mold to a rate at which gas is drawn away from the fusion front at a rate slower than it is introduced;

feeding barium-doped silica grain onto the intermediate glass layer; and fusing the barium-doped silica grain onto the intermediate glass layer to a depth of less than 0.2 mm.

2. The method of claim 1 wherein feeding barium-doped silica grain onto the intermediate glass layer comprises:

at least partially melting the barium-doped silica grain; and fusing the barium-doped silica grain to the intermediate glass layer.

3. The method of claim 2 wherein drawing air through the bulk silica grain and into ports distributed in the inner wall of the mold comprises drawing air at a rate of at least about 300 m³/hr while at least part of the intermediate layer of glass is formed.

4. The method of claim 2 wherein the barium-doped silica grain is doped with barium in a range of about 70-200 ppm.

5. The method of claim 2 wherein the barium-doped silica grain is doped with barium at about 100 ppm and wherein feeding barium-doped silica grain onto the intermediate glass layer comprises feeding between about 2 grams and about 8.5 grams per centimeter of outside diameter of the bulk grain layer.

6. The method of claim 2 wherein the barium-doped silica grain is sized between about 100 and about 300 micrometers.

7. The method of claim 2 wherein the layer formed by fusing the barium-doped silica grain to the intermediate glass layer is between about 0.08 mm and 0.2 mm thick.

8. The method of claim 2 wherein drawing air through the bulk silica grain and into ports distributed in the inner wall of the mold comprises drawing air at a rate of at least about 300 m³/hr while at least part of the intermediate layer of glass is formed; wherein the barium-doped silica grain is doped with barium at about 100 ppm; wherein feeding barium-doped silica grain onto the intermediate glass layer comprises feeding between about 2 grams and about 8.5 grams per centimeter of outside diameter of the bulk grain layer; wherein the barium-doped silica grain is sized between about 100 and about 300 micrometers; and wherein the layer formed by fusing the barium-doped silica grain to the intermediate glass layer is between about 0.08 mm and 0.2 mm thick.

9. A method for making a fused silica crucible comprising:

forming a bulk grain layer on an interior surface of a rotating crucible mold, the bulk grain layer having a bottom portion, a side portion, and a bulk grain layer interior surface;

generating a region of heat in the interior of the mold;

at least partially fusing the bulk grain layer to form an intermediate layer greater than approximately 2 millimeters and having less than about 1% bubbles by volume in cross-sectional area after a vacuum bake test in which the fused silica crucible is heated at approximately 1650 degrees C. for approximately three hours at a pressure of approximately 0.1 Pa; and depositing a barium-containing inner layer to a depth of less than an average 0.2 mm millimeters thickness on the intermediate layer interior surface.

10. The method of claim 9 wherein depositing a barium-containing inner layer to a depth of less than 0.2 mm on the intermediate layer interior surface comprises:

at least partially melting the barium-doped silica grain; and fusing the barium-doped silica grain to the intermediate layer interior surface.

11. The method of claim 10 wherein the rotating crucible mold has an inner mold surface defining a mold cavity and further having a plurality of channels formed in the mold and communicating with the inner mold surface and wherein the method further comprises evacuating gas from the mold at a rate of at least about 300 m³/hr during the initial fusing of the bulk grain layer.

12. The method of claim 10 wherein the barium-doped silica grain is doped with barium in a range of about 70-200 ppm.

13. The method of claim 10 wherein the barium-doped silica grain is doped with barium at about 100 ppm and wherein introducing barium-doped silica grain into the mold comprises introducing between about 2 grams and about 8.5 grams per centimeter of outside diameter of the bulk grain layer.

14. The method of claim 10 wherein the barium-doped silica grain is sized between about 100 and about 300 micrometers.

15. The method of claim 10 wherein the layer formed by fusing the barium-doped silica grain to the intermediate layer interior surface is between about 0.08 mm and 0.2 mm thick.

\* \* \* \* \*

UNITED STATES PATENT AND TRADEMARK OFFICE
CERTIFICATE OF CORRECTION

Page 1 of 2

PATENT NO. : 7,427,327 B2
APPLICATION NO. : 11/536517
DATED : September 23, 2008
INVENTOR(S) : Katsuhiko Kemmochi and Yasuo Ohama

It is certified that error appears in the above-identified patent and that said Letters Patent is hereby corrected as shown below:

In the drawings, Sheet 3, Fig. 7, please replace reference numeral "84" with --82--
In the drawings, Sheet 3, Fig. 7, please replace reference numeral "82" with --84--
At column 4, line 13, please replace "12" with --38--
At column 4, line 13, please replace "14" with --40--
At column 4, line 14, please replace "38" with --44--
At column 7, line 9, please replace "58" with --56--
At column 7, line 20, please replace "lawyer" with --layer--

Signed and Sealed this
Eighteenth Day of September, 2012

David J. Kappos
*Director of the United States Patent and Trademark Office*